US006000493A

United States Patent [19]

Chen

[11] Patent Number: 6,000,493

[45] Date of Patent: Dec. 14, 1999

[54] SOUND ACTIVATED LIGHTED WOOFER SPEAKER

[76] Inventor: Su-Yue Chen, No. 93, Sec. 1, Hsing-nan Road, Chong-Ho City, Taipei, Taiwan

[21] Appl. No.: 09/357,389

[22] Filed: Jul. 20, 1999

[51] Int. Cl.[6] .............................. F21V 33/00; H05K 5/00

[52] U.S. Cl. ............................ 181/141; 362/86; 362/253

[58] Field of Search .................................... 181/141, 148, 181/153, 150; 362/86, 253

[56] References Cited

U.S. PATENT DOCUMENTS

| | | | |
|---|---|---|---|
| 4,875,143 | 10/1989 | Fernandez | 362/86 |
| 5,772,307 | 6/1998 | Philyaw | 362/86 |
| 5,886,304 | 3/1999 | Schlenzig et al. | 181/153 |

*Primary Examiner*—Khanh Dang
*Attorney, Agent, or Firm*—Rosenberg, Klein & Lee

[57] ABSTRACT

A sound activated lighted woofer speaker comprising a cylindrical speaker, a circular grooved base, and a circular neon lighted tube with a transparent cover.

2 Claims, 1 Drawing Sheet

SOUND ACTIVATED LIGHTED WOOFER SPEAKER

BACKGROUND OF THE INVENTION

I. Field of the Invention

A sound activated lighted speaker woofer is a speaker with a neon light bulb and a transparent cover around the speaker. The neon lighted tube is activated when the speaker is in use. The said speaker promotes a soothing and romantic environment.

II. Prior Art

Conventional woofer speakers are placed inside speaker boxes which are required to produce high-quality acoustics. Nowadays, consumers enjoy a higher quality of leisure time than before, demanding an enhanced atmosphere on occasion. The mere appearance of conventional speakers cannot provide the desired ambience on special occasions.

The object of the present invention is to provide a woofer speaker with sound-activated lighting mechanism. A sound-activated speaker light comprises a cylindrical speaker, a circular grooved base, is a circular neon lighted tube, and a transparent circular frame cover. When the woofer speaker is in use, it activates the neon lighting. It can be used on a variety of occasions such as camping, inside a car, or in a dark room to promote a pleasant atmosphere.

SUMMARY OF THE INVENTION

The present invention is a sound activated lighted woofer speaker comprising a cylindrical speaker, a circular grooved base in front, a circular neon tube covered by a transparent circular frame cover.

DETAILED DESCRIPTION OF THE PREFERRED EMBODIMENT

Figure 1:
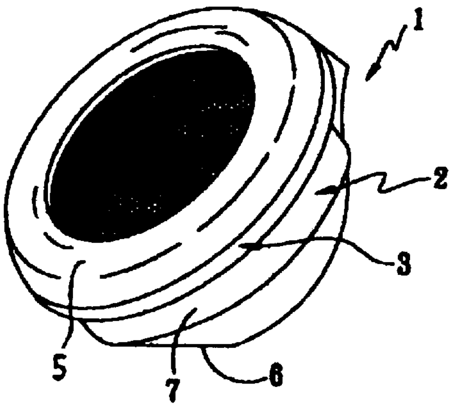
FIG. 1 is a perspective view of a preferred embodiment.
Figure 2:
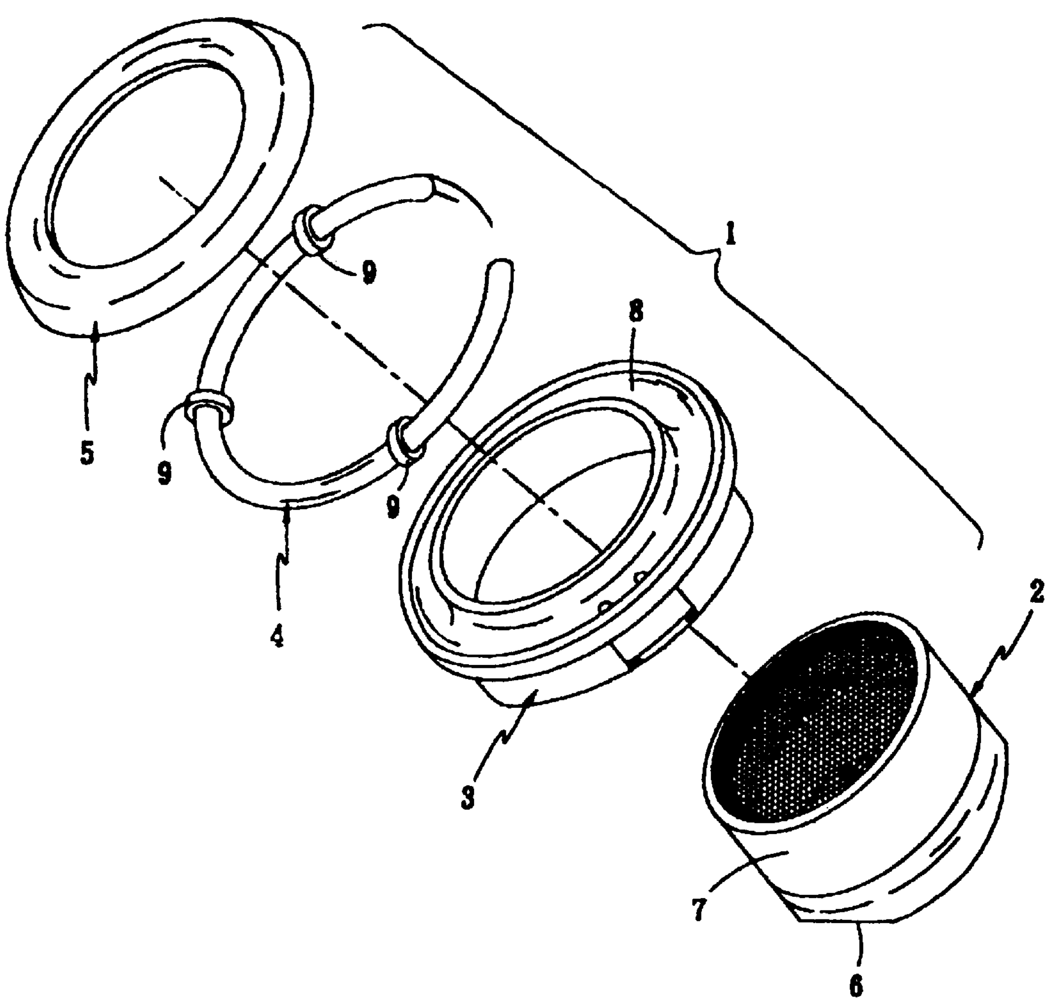
FIG. 2 is a drawing of the dissembling view.

Referring to FIGS. 1 and 2 the sound-activated lighted woofer speaker(1) consists of cylindrical speaker (2), a circular base (3), a neon-lighted tube (4), and a transparent cover (5). A cylindrical speaker (2) is attached to an angled base (6) to steady the base when placed on the ground. A cylindrical casing (7) can be capped and secured by a circular base (3), which is a circular shape with an inner diameter matched with the cylindrical casing (7), which is in front of the cylindrical speaker (2). There is a grooved circular structure (8) attached to the circular base (3), which the neon lighted tube (4) can be inlayed. The groove of the grooved circle (8) is matched with the size of the neon lighted tube (4) that has spacers (9) hooked on it, which fastens the neon lighted tube (4) inlayed within the grooved circle (8) and the clear cover frame (5) tightly. Being secured as such, the arrangement absorbs vibration from the cylindrical speaker (2) to avoid ruining the neon lighting tube (4). The function of the clear cover frame (5) is to cover the grooved circle (8) and secure the neon lighting tube (4) inside. It is installed in front of the grooved circle (8). When the cylindrical speaker (2) is in use, the neon lighting tube (4) will be activated, emanating soft lighting through the clear cover frame (5).

I claim:

1. A sound activated lighted woofer speaker comprising: a cylindrical speaker that has

- a cylindrical shape in front of it attached to a circular base,
- a circular base which is a circular shape with an inner diameter matching the size of the cylindrical speaker to secure the said speaker,
- a grooved circular structure attached to the circular base, into which the neon lighted tube can be inlayed,
- a neon lighted tube matched with the size of the groove of the grooved circle, and
- a plurality of spacers hook on the neon lighted tube absorbing the vibration from the cylindrical speaker to avoid ruining the neon lighting tube,
- a clear cover frame to cover the grooved circle located in front of the grooved circle to secure the said grooved circle.

2. A device as described in claim 1 wherein an angled base is attached behind the speaker.

* * * * *